US008457807B2

(12) United States Patent
Nastacio

(10) Patent No.: US 8,457,807 B2
(45) Date of Patent: Jun. 4, 2013

(54) THERMAL RELATIONSHIPS BASED WORKLOAD PLANNING

(75) Inventor: Denilson Nastacio, Raleigh, NC (US)

(73) Assignee: International Business Machines Corporation, Armonk, NY (US)

(*) Notice: Subject to any disclaimer, the term of this patent is extended or adjusted under 35 U.S.C. 154(b) by 374 days.

(21) Appl. No.: 12/858,774

(22) Filed: Aug. 18, 2010

(65) Prior Publication Data

US 2012/0046800 A1 Feb. 23, 2012

(51) Int. Cl.
*G05D 23/00* (2006.01)

(52) U.S. Cl.
USPC .......................................................... 700/300

(58) Field of Classification Search
USPC ................... 700/276, 277, 300; 709/223, 224, 709/226; 713/300, 320, 340
See application file for complete search history.

(56) References Cited

U.S. PATENT DOCUMENTS

| | | | |
|---|---|---|---|
| 6,167,316 A | 12/2000 | Gloudeman et al. | |
| 7,426,453 B2* | 9/2008 | Patel et al. | 702/185 |
| 7,447,920 B2* | 11/2008 | Sharma et al. | 713/300 |
| 7,567,844 B2 | 7/2009 | Thomas et al. | |
| 8,086,359 B2* | 12/2011 | Spiers et al. | 700/300 |
| 8,260,928 B2* | 9/2012 | Pienta et al. | 709/226 |
| 2003/0200050 A1 | 10/2003 | Sharma et al. | |
| 2003/0226004 A1 | 12/2003 | Abbondanzio et al. | |
| 2004/0132398 A1 | 7/2004 | Sharp et al. | |
| 2006/0047808 A1* | 3/2006 | Sharma et al. | 709/224 |
| 2006/0168975 A1 | 8/2006 | Malone et al. | |
| 2009/0132097 A1* | 5/2009 | Sharma et al. | 700/300 |
| 2009/0216381 A1 | 8/2009 | Gooch et al. | |
| 2009/0327012 A1* | 12/2009 | Sharma et al. | 705/8 |
| 2010/0057259 A1 | 3/2010 | Dawson et al. | |
| 2011/0029154 A1* | 2/2011 | Shah et al. | 700/300 |
| 2011/0295443 A1* | 12/2011 | Shah et al. | 700/300 |

OTHER PUBLICATIONS

Moore et al; "Weatherman: Automated, Online and Predictive Thermal Mapping and Management for Data Centers", Autonomic Computing, 2006. ICAC '06. IEEE International Conference on Publication Year: 2006 , pp. 155-164.
Nathuji et al; "Exploiting Platform Heterogeneity for Power Efficient Data Centers", Autonomic Computing, 2007. ICAC '07. Fourth International Conference on Publication Year: 2007 , pp. 5-5.
Schmidt et al; "Challenges of data center thermal management", IBM Journal of Research and Development; v49, i4, 2005, pp. 709-723.
IBM, IPCOM000188706D: "Method and system of automatic and intelligent power allocation in chassis", Oct. 20, 2009.

* cited by examiner

*Primary Examiner* — Dave Robertson
(74) *Attorney, Agent, or Firm* — Garg Law Firm, PLLC; Rakesh Garg; Jeffrey S. LaBaw

(57) ABSTRACT

A system, and computer usable program product for thermal relationships based workload planning in a data processing environment are provided in the illustrative embodiments. For a data processing system having a cooling correspondence with a cooling unit in the data processing environment, a determination is made of a fraction of an additional heat generation potential of the data processing system that the cooling unit will have to dissipate. Using the fraction and a cooling capacity utilization of the cooling unit at a given time, an expected cooling capacity utilization is computed. A workload on the data processing system is adjusted in response to the expected cooling capacity utilization exceeding a threshold.

13 Claims, 5 Drawing Sheets

THERMAL RELATIONSHIPS BASED WORKLOAD PLANNING

RELATED APPLICATIONS

The present invention is related to similar subject matter of co-pending and commonly assigned U.S. patent application Ser. No. 12/858,645 entitled "DISCOVERING THERMAL RELATIONSHIPS IN A DATA PROCESSING ENVIRONMENT," filed on Aug. 18, 2010, which is hereby incorporated by reference.

BACKGROUND OF THE INVENTION

1. Field of the Invention

The present invention relates generally to an improved data processing system, and in particular, to operating a data processing environment with improved efficiency. More particularly, the present invention relates to a system, and computer usable program code for planning workloads that are to be executed in a data processing environment based on thermal relationships existing between data processing systems and cooling equipment in the data processing environment.

2. Description of the Related Art

Data processing environments, such as data centers, often include several data processing systems and facilities equipment. The data processing systems perform or support the computational activities of the data processing environment and the facilities equipment maintain the data processing systems within operating parameters such as by maintaining desirable temperature, or ensuring adequate power supply.

One type of facilities equipment may be classified as cooling unit or cooling equipment. A cooling unit is any equipment that facilitates the dissipation of heat generated as a byproduct of operating the data processing systems in the data processing environment. An exhaust fan, an air conditioning unit, air ducts, thermostats, and liquid radiator units are all examples of cooling equipment.

Often, a data processing environment employs multiple cooling units to maintain desirable temperatures within the data processing environment. Normally, the data processing environment may also include several data processing systems, which generate the heat that the cooling units dissipate. The cooling units are expected to maintain the air in the data processing environment at a desirable temperature.

SUMMARY OF THE INVENTION

The illustrative embodiments provide a system, and computer usable program product for thermal relationships based workload planning in a data processing environment. An embodiment determines, for a data processing system having a cooling correspondence with a cooling unit in the data processing environment, a fraction of an additional heat generation potential of the data processing system that the cooling unit will have to dissipate. The embodiment computes, using the fraction and a cooling capacity utilization of the cooling unit at a given time, an expected cooling capacity utilization. The embodiment adjusts a workload on the data processing system, in response to the expected cooling capacity utilization exceeding a threshold.

BRIEF DESCRIPTION OF THE DRAWINGS

The novel features believed characteristic of the invention are set forth in the appended claims. The invention itself; however, as well as a preferred mode of use, further objectives and advantages thereof, will best be understood by reference to the following detailed description of an illustrative embodiment when read in conjunction with the accompanying drawings, wherein:

DETAILED DESCRIPTION OF THE PREFERRED EMBODIMENT

Figure 1:
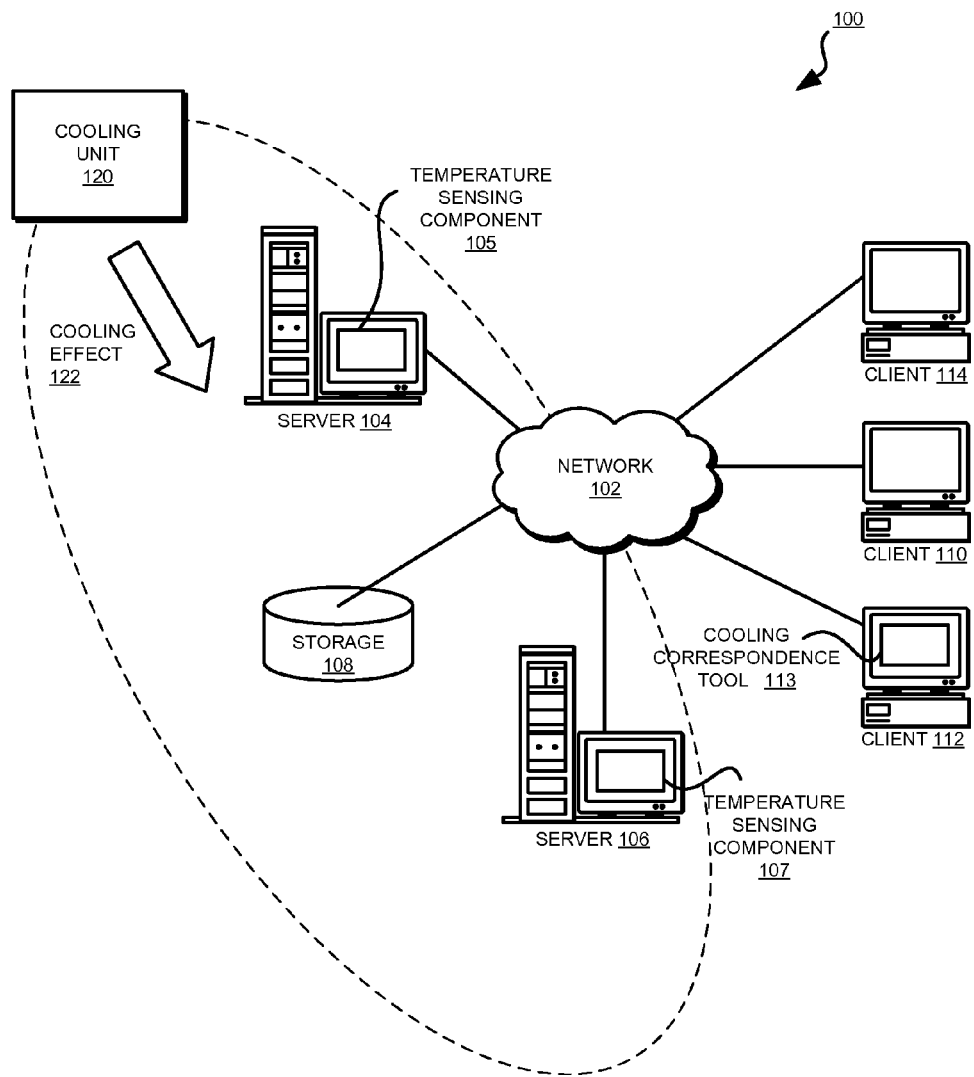
FIG. 1 depicts a pictorial representation of a network of data processing systems in which the illustrative embodiments may be implemented.

A workload is a computational task to be executed on a data processing system. Scheduling workloads to execute on a data processing system requires consideration of many factors, which concern available computing resources at the time the workload is to be executed.

The invention recognizes that in a data processing environment, such as a data center, another factor that should be considered in planning and scheduling the workloads is the available cooling capacity in the data processing environment at the time the workload is to execute. Data processing systems produce heat while operating. As the utilization of a data processing system increases, so does the heat output.

The invention recognizes that scheduling a workload on a data processing system may increase the data processing system's utilization, thereby increasing the data processing system's heat output. The invention recognizes that sufficient cooling capacity may not be available at certain times to dissipate the extra heat output from such workloads. The invention also recognizes that cooling efficiency may be better in certain locations in the data processing environment, such as directly under a cooling vent, as compared to certain other locations, such as in obscured corners.

The invention also recognizes that data processing systems are often relocated from one area of the data processing environment to another, such as for reconfiguring a client's rack. A data processing system that may have been suitable for executing a particular workload at a particular time may no longer be suitable for the same given the data processing system's new location in the data processing environment.

The invention further recognizes that cooling units may be added or relocated in a data processing environment. The adding, removing, or relocating of cooling units may also affect cooling of data processing systems in the data processing environment in a similar manner. Accordingly, a workload that may have executed without overloading the cooling capacity at one time may have to be reconfigured to another execution schedule to accommodate changes in the available cooling capacity.

The invention recognizes that adequate cooling of the data processing systems operating in a data processing environment is not only important from a facilities management point of view but also from a data processing system performance point of view. A workload planned for execution together with a second workload may cause the cooling units to maintain the temperature of the data processing system at or below a threshold; however, when planned in conjunction with a different second workload, the workload may cause the temperature of the data processing system to rise and the performance to deteriorate.

The illustrative embodiments used to describe the invention generally address and solve the above-described problems and other problems related to thermal conditions in data processing environments. The illustrative embodiments of the invention provide a computer usable program product, and data processing system for thermal relationships based workload planning in a data processing environment. An embodiment of the invention may be used for planning workloads using thermal relationships discovered using certain embodiments described in a related disclosure.

An embodiment may enable predicting effects on data processing systems' performance, cooling units' performance, or both, based on planned workloads. For example, using an embodiment, an administrator may be able to determine whether planning a workload on a particular data processing system at a particular time will adversely affect the performance of the data processing system given the data processing system's thermal relationships. As another example, an embodiment may enable an administrator to relocate a data processing system to utilize available cooling capacity of a certain cooling unit, improve the data processing system's performance, and increase the data processing system's utilization, without increasing operating costs. An administrator may be able to use an embodiment to configure workloads such that most tasks are executed in a desired timeframe without overloading the given cooling capacity.

The illustrative embodiments are described with respect to certain data only as examples. Such descriptions are not intended to be limiting on the invention. For example, an illustrative embodiment described with respect to adjusting a workload's configuration can be implemented by adjusting a workload's schedule in a similar manner within the scope of the invention.

Furthermore, the illustrative embodiments may be implemented with respect to any type of data processing system. For example, an embodiment of the invention may be implemented with respect to any type of client system, server system, platform, or a combination thereof.

The illustrative embodiments are further described with respect to certain configurations only as examples. Such descriptions are not intended to be limiting on the invention. For example, an illustrative embodiment described with respect to a heating ventilation and air conditioning (HVAC) type cooling unit can be implemented using rack mounted cooling unit in a similar manner within the scope of the invention.

An application implementing an embodiment may take the form of data objects, code objects, encapsulated instructions, application fragments, drivers, routines, services, systems—including basic I/O system (BIOS), and other types of software implementations available in a data processing environment. For example, Java® Virtual Machine (JVM®), Java® object, an Enterprise Java Bean (EJB®), a servlet, or an applet may be manifestations of an application with respect to which, within which, or using which, the invention may be implemented. (Java, JVM, EJB, and other Java related terminologies are registered trademarks of Sun Microsystems, Inc. in the United States and other countries.)

An illustrative embodiment may be implemented in hardware, software, or a combination thereof. The examples in this disclosure are used only for the clarity of the description and are not limiting on the illustrative embodiments. Additional or different information, data, operations, actions, tasks, activities, and manipulations will be conceivable from this disclosure for similar purpose and the same are contemplated within the scope of the illustrative embodiments.

The illustrative embodiments are described using specific code, data structures, file systems, designs, architectures, layouts, schematics, and tools only as examples and are not limiting on the illustrative embodiments. Furthermore, the illustrative embodiments are described in some instances using particular data processing environments only as an example for the clarity of the description. The illustrative embodiments may be used in conjunction with other comparable or similarly purposed structures, systems, applications, or architectures.

Any advantages listed herein are only examples and are not intended to be limiting on the illustrative embodiments. Additional or different advantages may be realized by specific illustrative embodiments. Furthermore, a particular illustrative embodiment may have some, all, or none of the advantages listed above.

Figure 2:
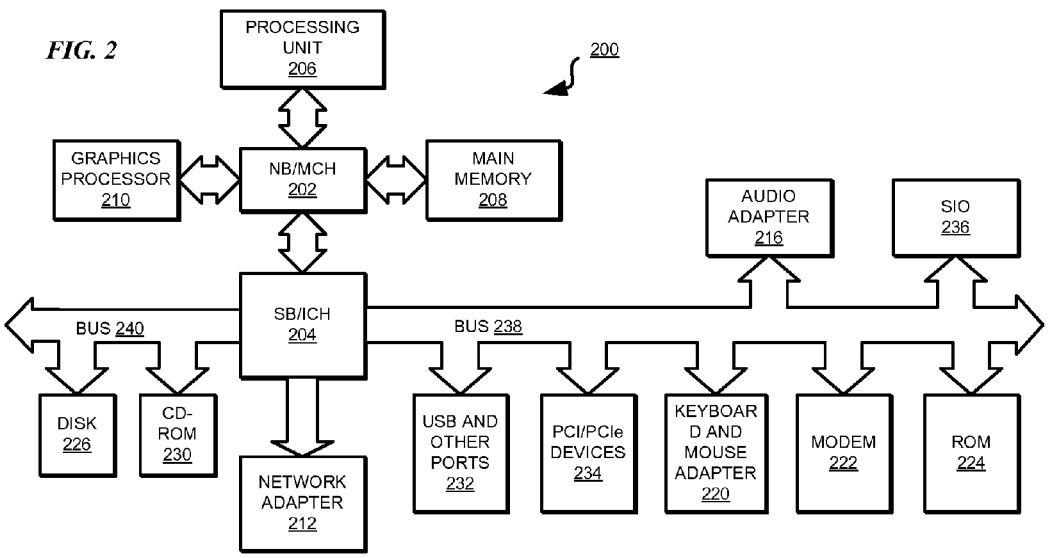
FIG. 2 depicts a block diagram of a data processing system in which the illustrative embodiments may be implemented.

With reference to the figures and in particular with reference to FIGS. 1 and 2, these figures are example diagrams of data processing environments in which illustrative embodiments may be implemented. FIGS. 1 and 2 are only examples and are not intended to assert or imply any limitation with regard to the environments in which different embodiments may be implemented. A particular implementation may make many modifications to the depicted environments based on the following description.

FIG. 1 depicts a pictorial representation of a network of data processing systems in which illustrative embodiments may be implemented. Data processing environment 100 is a network of computers in which the illustrative embodiments may be implemented. Data processing environment 100 includes network 102. Network 102 is the medium used to provide communications links between various devices and computers connected together within data processing environment 100. Network 102 may include connections, such as wire, wireless communication links, or fiber optic cables. Server 104 and server 106 couple to network 102 along with storage unit 108. Software applications may execute on any computer in data processing environment 100.

In addition, clients 110, 112, and 114 couple to network 102. A data processing system, such as server 104 or 106, or client 110, 112, or 114 may contain data and may have software applications or software tools executing thereon.

Servers 104 and 106 may include temperature sensing components 105 and 107 respectively. Temperature sensing components 105 and 107 may each be a temperature measuring device, a temperature measuring software application, or a combination thereof, installed in or associated with servers 104 and 106 respectively.

Server 106 may also include workload planning application 109. Workload planning application 109 may be an application according to an embodiment and may be used for planning and scheduling workloads on one or more data processing systems in data processing environment 100.

Client 112 may include cooling correspondence tool 113. Cooling correspondence tool 113 may be an embodiment of the invention implemented as an application for computing the weighted mapping or correspondence—the thermal relationship—between a data processing system, such as server 104, and a cooling unit, such as cooling unit 120. Workload planning application 109 may use the cooling correspondence data from cooling correspondence tool 113.

Cooling unit 120 may provide cooling effect 122, which may be a reduction in the ambient air temperature in the vicinity of certain data processing systems in data processing environment 100. For example, cooling effect 122 may cause cooling of servers 104 and 106, storage 108, and some networking equipment in network 102.

Servers 104 and 106, storage unit 108, and clients 110, 112, and 114 may couple to network 102 using wired connections, wireless communication protocols, or other suitable data connectivity. Clients 110, 112, and 114 may be, for example, personal computers or network computers.

In the depicted example, server 104 may provide data, such as boot files, operating system images, and applications to clients 110, 112, and 114. Clients 110, 112, and 114 may be clients to server 104 in this example. Clients 110, 112, 114, or some combination thereof, may include their own data, boot files, operating system images, and applications. Data processing environment 100 may include additional servers, clients, and other devices that are not shown.

In the depicted example, data processing environment 100 may be the Internet. Network 102 may represent a collection of networks and gateways that use the Transmission Control Protocol/Internet Protocol (TCP/IP) and other protocols to communicate with one another. At the heart of the Internet is a backbone of data communication links between major nodes or host computers, including thousands of commercial, governmental, educational, and other computer systems that route data and messages. Of course, data processing environment 100 also may be implemented as a number of different types of networks, such as for example, an intranet, a local area network (LAN), or a wide area network (WAN). FIG. 1 is intended as an example, and not as an architectural limitation for the different illustrative embodiments.

Among other uses, data processing environment 100 may be used for implementing a client server environment in which the illustrative embodiments may be implemented. A client server environment enables software applications and data to be distributed across a network such that an application functions by using the interactivity between a client data processing system and a server data processing system. Data processing environment 100 may also employ a service-oriented architecture where interoperable software components distributed across a network may be packaged together as coherent business applications.

With reference to FIG. 2, this figure depicts a block diagram of a data processing system in which illustrative embodiments may be implemented. Data processing system 200 is an example of a computer, such as server 104 or client 110 in FIG. 1, in which computer usable program code or instructions implementing the processes may be located for the illustrative embodiments.

In the depicted example, data processing system 200 employs a hub architecture including North Bridge and memory controller hub (NB/MCH) 202 and south bridge and input/output (I/O) controller hub (SB/ICH) 204. Processing unit 206, main memory 208, and graphics processor 210 are coupled to north bridge and memory controller hub (NB/MCH) 202. Processing unit 206 may contain one or more processors and may be implemented using one or more heterogeneous processor systems. Graphics processor 210 may be coupled to the NB/MCH through an accelerated graphics port (AGP) in certain implementations. In some configurations, processing unit 206 may include NB/MCH 202 or parts thereof.

In the depicted example, local area network (LAN) adapter 212 is coupled to south bridge and I/O controller hub (SB/ICH) 204. Audio adapter 216, keyboard and mouse adapter 220, modem 222, read only memory (ROM) 224, universal serial bus (USB) and other ports 232, and PCI/PCIe devices 234 are coupled to south bridge and I/O controller hub 204 through bus 238. Hard disk drive (HDD) 226 and CD-ROM 230 are coupled to south bridge and I/O controller hub 204 through bus 240. PCI/PCIe devices may include, for example, Ethernet adapters, add-in cards, and PC cards for notebook computers. PCI uses a card bus controller, while PCIe does not. ROM 224 may be, for example, a flash binary input/output system (BIOS). In some configurations, ROM 224 may be an Electrically Erasable Programmable Read-Only Memory (EEPROM) or any other similarly usable device. Hard disk drive 226 and CD-ROM 230 may use, for example, an integrated drive electronics (IDE) or serial advanced technology attachment (SATA) interface. A super I/O (SIO) device 236 may be coupled to south bridge and I/O controller hub (SB/ICH) 204.

An operating system runs on processing unit 206. The operating system coordinates and provides control of various components within data processing system 200 in FIG. 2. The operating system may be a commercially available operating system such as AIX® (AIX is a trademark of International Business Machines Corporation in the United States and other countries), Microsoft® Windows® (Microsoft and Windows are trademarks of Microsoft Corporation in the United States and other countries), or Linux® (Linux is a trademark of Linus Torvalds in the United States and other countries). An object oriented programming system, such as the Java™ programming system, may run in conjunction with the operating system and provides calls to the operating system from Java™ programs or applications executing on data processing system 200 (Java is a trademark of Sun Microsystems, Inc., in the United States and other countries).

Instructions for the operating system, the object-oriented programming system, and applications or programs are located on storage devices, such as hard disk drive 226, and may be loaded into main memory 208 for execution by processing unit 206. The processes of the illustrative embodiments may be performed by processing unit 206 using computer-implemented instructions, which may be located in a memory, such as, for example, main memory 208, read only memory 224, or in one or more peripheral devices.

The hardware in FIGS. 1-2 may vary depending on the implementation. Other internal hardware or peripheral devices, such as flash memory, equivalent non-volatile memory, or optical disk drives and the like, may be used in addition to or in place of the hardware depicted in FIGS. 1-2. In addition, the processes of the illustrative embodiments may be applied to a multiprocessor data processing system.

In some illustrative examples, data processing system 200 may be a personal digital assistant (PDA), which is generally configured with flash memory to provide non-volatile memory for storing operating system files and/or user-generated data. A bus system may comprise one or more buses, such as a system bus, an I/O bus, and a PCI bus. Of course, the bus system may be implemented using any type of communications fabric or architecture that provides for a transfer of data between different components or devices attached to the fabric or architecture.

A communications unit may include one or more devices used to transmit and receive data, such as a modem or a network adapter. A memory may be, for example, main memory 208 or a cache, such as the cache found in north bridge and memory controller hub 202. A processing unit may include one or more processors or CPUs.

The depicted examples in FIGS. 1-2 and above-described examples are not meant to imply architectural limitations. For example, data processing system 200 also may be a tablet computer, laptop computer, or telephone device in addition to taking the form of a PDA.

Figure 3:
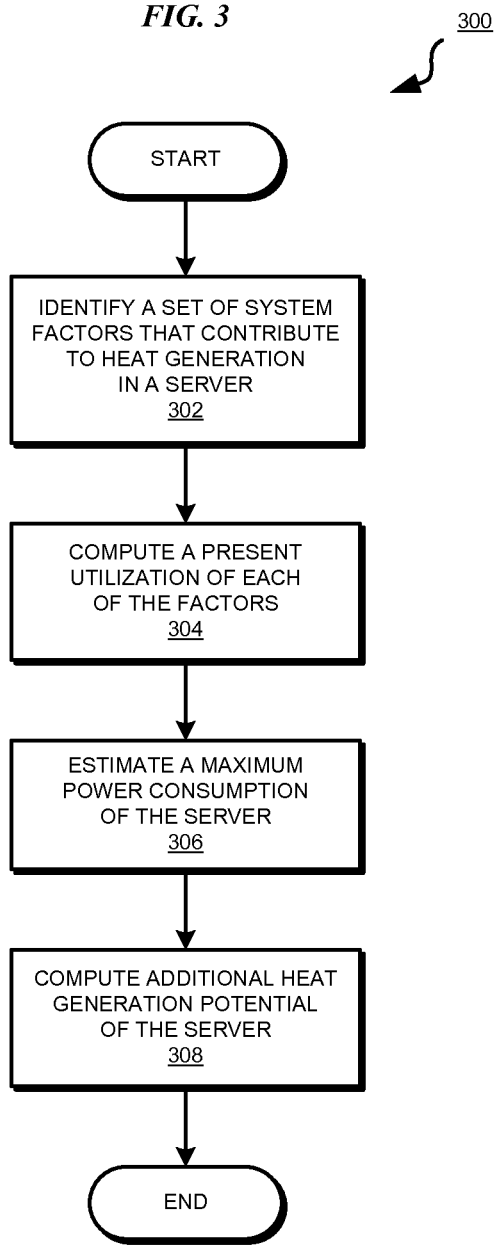
FIG. 3 depicts a flowchart of a process of determining thermal characteristics of a data processing system in accordance with an illustrative embodiment.

With reference to FIG. 3, this figure depicts a flowchart of a process of determining thermal characteristics of a data processing system in accordance with an illustrative embodiment. Process 300 may be implemented using workload planning application 109 in FIG. 1.

Process 300 begins by identifying a set of system factors that contribute to heat generation in a data processing system, such as a server (step 302). A set of factors is one or more factors. Different factors contribute to heat output of a data processing system predominantly under different circumstances.

For example, when configured with a computationally intensive workload, the CPU of a data processing system may be the predominant heat producer. Accordingly, CPU usage may be a factor contributing to heat output of the data processing system.

As another example, when configured with an I/O intensive workload, the I/O controller and the hard disks may be the predominant heat producers. Accordingly, I/O usage may be a factor contributing to heat output of the data processing system. In a similar manner, for appropriate workloads, network throughput, memory usage, and any other similar aspect of a data processing system can be a factor contributing to heat output of the data processing system.

Process 300 computes a present utilization of each of the factors in the set (step 304). Only as an example to illustrate the computation of step 304, consider that the CPU usage is the predominant factor for heat production, all others being negligible by comparison. The utilization of the CPU can be computed as follows, $$\text{utilization}_i = U_{AVG}\text{CPU}_i * (\text{AVG\_Clock\_CPU}_i / \text{MAX\_Clock\_CPU}_i)$$

Where, $U_{AVG}\text{CPU}_i$ is the average CPU utilization percentage for the $i^{th}$ server;

$\text{AVG\_Clock\_CPU}_i$ is the average CPU clock speed percentage for the $i^{th}$ server;

$\text{MAX\_Clock\_CPU}_i$ is the maximum CPU clock speed percentage for the $i^{th}$ server; and $\text{utilization}_i$ is the estimated utilization rate for the $i^{th}$ server.

The computation of the utilization need not be restricted to this example formula. Other methods of computing a server's utilization based on one or more factors is contemplated within the scope of the invention.

Process 300 computes a maximum power consumption of the server (step 306). Only as an example to illustrate the computation of step 306, continue to consider that the CPU usage is the predominant factor for heat production, all others being negligible by comparison. The maximum power consumption can be computed as follows, $$\text{MAX\_Power}_i = \text{Power}_i / \text{utilization}_i$$

Where, $\text{utilization}_i$ is the utilization computed in step 304;

$\text{Power}_i$ is the average power usage for the $i^{th}$ server; and $\text{MAX\_Power}_i$ is the estimated maximum power usage for the $i^{th}$ server.

Of course, maximum power usage may be computed by other means without limitation within the scope of the invention. For example, another method of extrapolating historic power consumption data may be used for estimating maximum power consumption of a server.

Process 300 computes an additional heat generation potential of the server (step 308). Process 300 ends thereafter. Only as an example to illustrate the computation of step 308, continuing with the above example, the additional heat generation potential of a server can be computed as follows, $$\text{Heat\_Potential}_i = \text{MAX\_Power}_i - \text{Power}_i$$

Where, $\text{Heat\_potential}_i$ is the estimated additional amount of heat the $i^{th}$ server can put on the environment when running at full capacity.

Once process 300 computes the Heat_Potential value for a set of data processing systems in a cooling zone, a temperature map can be created using the cooling correspondence of the various data processing systems. For example, the cooling correspondence between particular data processing systems and cooling units, as described elsewhere in the present disclosure, may be used as weights for the additional heat generation potential of the various data processing systems. For example, the following example equation may be used for computing the heat increase to be dissipated by a particular cooling unit if the various data processing systems utilizing its cooling capacity do generate additional heat up to their estimated additional heat potential, $$\text{Heat\_Increase}_j = \sum_{i=1}^{n} (\text{Heat\_Potential}_i * \text{Cooling\_Correspondence}_{ij})$$

Where, $\text{Heat\_Increase}_j$ is the amount of additional heat expected to be handled by the $j^{th}$ cooling unit;

$\text{Heat\_Potential}_i$ is the amount of additional heat expected from the $i^{th}$ server when running at full capacity;

$\text{Cooling\_Correspondence}_{ij}$ is the cooling correspondence between the $i^{th}$ server and the $j^{th}$ cooling unit;

n is the number of servers in the data center with a "Cooling_Correspondence$_{ij}$" greater than zero.

As an example computation, assume that a data processing environment includes two cooling units (CU1 and CU2) and four data processing systems (DP1, DP2, DP3, and DP4). The heat potential of the various data processing systems and the cooling correspondence between the various data processing systems and the cooling units may result in the example table as follows,

| Cooling Unit | Data processing system | Cooling correspondence | Heat potential (Watts) | Effective heat increase potential when heat potential is weighted by the cooling correspondence |
|---|---|---|---|---|
| CU1 | DP1 | 90% | 500 | 500 * 0.9 = 450 |
| CU1 | DP2 | 90% | 500 | 500 * 0.9 = 450 |
| CU1 | DP3 | 40% | 500 | 500 * 0.4 = 200 |
| CU1 | DP3 | 50% | 500 | 500 * 0.5 = 250 |
| CU2 | DP4 | 90% | 500 | 500 * 0.9 = 450 |

Assume that each of the cooling units CU1 and CU2 has a 10,000 Watts of cooling capacity, and that each unit is already dissipating 9000 Watts of heat energy. With the above example table and this current cooling capacity utilization information, an application, such as workload planning application 109 in FIG. 1, may determine that if DP1, DP2, and DP3 each executes at maximum utilization, the cooling unit CU1 will be overloaded (10000−9000−450−450−200=−100). Accordingly, as one example solution, a workload on either DP1, or DP2, or DP3 may be transferred to another data processing system not being cooled by CU1; or, as another example solution, may be scheduled at a different time.

Figure 4:
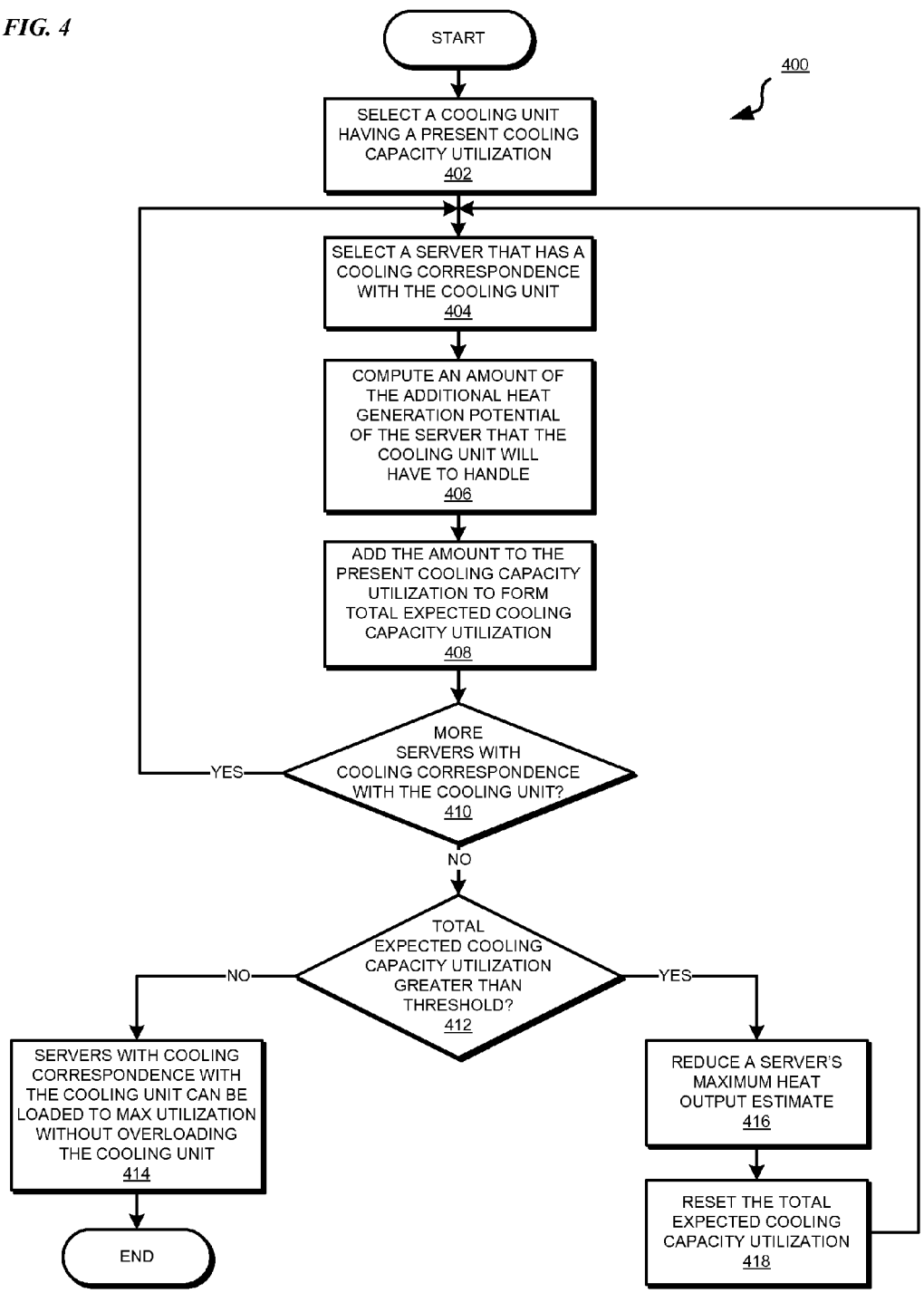
FIG. 4 depicts a flowchart of an example process of planning workloads based on thermal relationships in accordance with an illustrative embodiment.

With reference to FIG. 4, this figure depicts a flowchart of an example process of planning workloads based on thermal relationships in accordance with an illustrative embodiment. Process 400 may be implemented in workload planning application 109 in FIG. 1. Process 400 illustrates the steps involved in the above example computation using the example table and the example cooling capacity utilization.

Process 400 begins by selecting a cooling unit having a present cooling capacity utilization (step 402). Process 400 selects a data processing system, such as a server, that has a cooling correspondence with the cooling unit (step 404).

Process 400 computes an amount of the additional heat generation potential of the server that the cooling unit will have to handle (step 406). For example, this calculation may use the cooling correspondence in the manner described with respect to the above table.

Process 400 combines the amount computed in step 406 to the present cooling capacity utilization, forming a total expected cooling capacity utilization (step 408). Process 400 determines whether more data processing systems remain that have cooling correspondence with the selected cooling unit (step 410). If more such data processing systems remain ("Yes" path of step 410), process 400 returns to step 404.

If no more of such data processing systems remain ("No" path of step 410), process 400 determines whether the total expected cooling capacity utilization exceeds a threshold, such as a maximum usable cooling capacity of the selected cooling unit (step 412). If the threshold is not exceeded ("No" path of step 412), process 400 concludes that the data processing systems having cooling correspondence with the selected cooling unit may be loaded up to their maximum utilization without overloading the cooling unit (step 414). Process 400 ends thereafter.

If the threshold is exceeded ("Yes" path of step 412), process 400 may report, notify, instruct, or affect a reduction in a particular data processing system's maximum heat output estimate (step 416). For example, a data processing system's maximum utilization may have to be limited to a number smaller than previously set maximum utilization. Process 400 may reset the total expected cooling capacity utilization (step 418). Process 400 may return to step 404 and begin re-computing with the changed maximum utilization.

Figure 5:
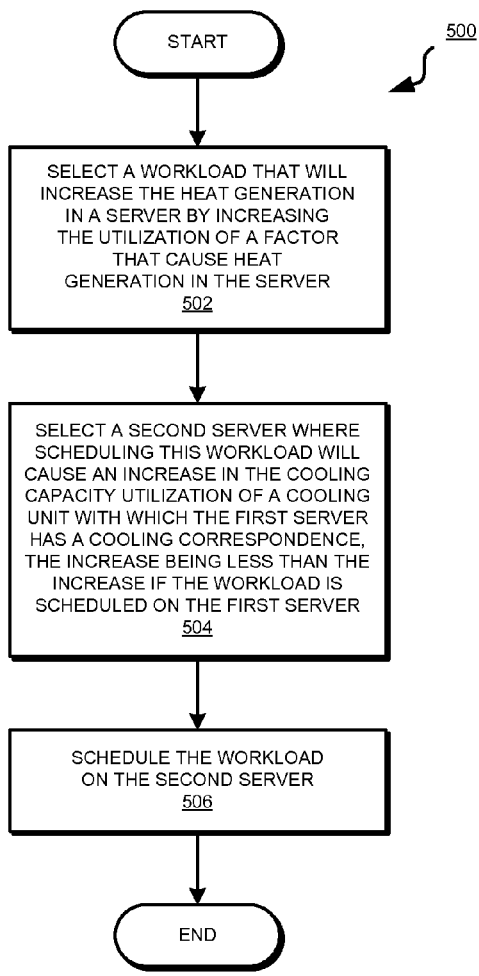
FIG. 5 depicts a flowchart of an example workload selection process based on thermal relationships in accordance with an illustrative embodiment.

With reference to FIG. 5, this figure depicts a flowchart of an example workload selection process based on thermal relationships in accordance with an illustrative embodiment. Process 500 may be implemented in workload planning application 109 in FIG. 1.

Process 500 begins by selecting a workload that will increase the heat generation in a server by increasing the utilization of a factor that is predominantly responsible for heat generation in the server (step 502). Process 500 selects a second server where scheduling this workload will cause an increase in the cooling capacity utilization of a cooling unit with which the first server has a cooling correspondence, the increase being less than the increase if the workload is scheduled on the first server (step 504).

Process 500 schedules the workload on the second server (step 506). Process 500 ends thereafter.

Figure 6:
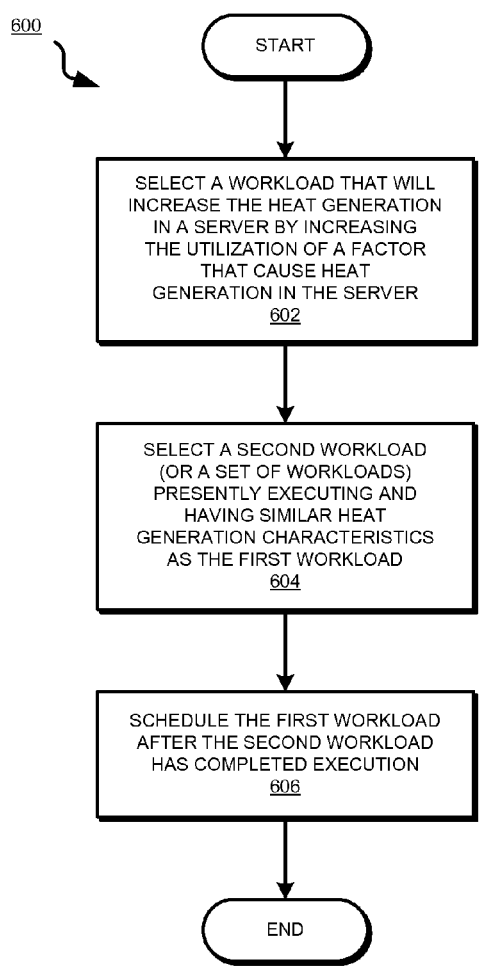
FIG. 6 depicts a flowchart of another example workload selection process based on thermal relationships in accordance with an illustrative embodiment.

With reference to FIG. 6, this figure depicts a flowchart of another example workload selection process based on thermal relationships in accordance with an illustrative embodiment. Process 600 may be implemented in workload planning application 109 in FIG. 1.

Process 600 begins by selecting a workload that will increase the heat generation in a server by increasing the utilization of a factor that is predominantly responsible for heat generation in the server (step 602). Process 600 selects a second workload, or a set of workloads, presently executing and having similar heat generation characteristics as the first workload of step 602 (step 604).

Process 600 schedules the first workload after the second workload has completed execution (step 606). Process 600 may end thereafter.

The workload selection, scheduling, or planning processes of FIGS. 5 and 6 are not intended to be limiting on the invention. Many other ways of combining workloads on different servers will become apparent from this disclosure to those of ordinary skill in the art. Such other ways of combining are contemplated within the scope of the invention.

The components in the block diagrams and the steps in the flowcharts described above are described only as examples. The components and the steps have been selected for the clarity of the description and are not limiting on the illustrative embodiments of the invention. For example, a particular implementation may combine, omit, further subdivide, modify, augment, reduce, or implement alternatively, any of the components or steps without departing from the scope of the illustrative embodiments. Furthermore, the steps of the processes described above may be performed in a different order within the scope of the invention.

Thus, an apparatus, and computer program product are provided in the illustrative embodiments for thermal relationships based workload planning in a data processing environment. Using an embodiment of the invention, thermal relationships between heat sources—the data processing systems—and cooling units can be used for improving workload scheduling without exceeding available cooling capacity. Such thermal relationships based workload planning may allow improved utilization of available cooling equipment, data processing system, and other resources. Thermal relationships discovered by an embodiment can be used to, for example, improve cooling capacity underutilization, predict cooling capacity overload, predict data processing system underperformance, and configure data processing systems to use the available cooling capacity optimally for the workload that is to be executed.

The invention can take the form of an entirely software embodiment, or an embodiment containing both hardware and software elements. In a preferred embodiment, the invention is implemented in software or program code, which includes but is not limited to firmware, resident software, and microcode.

As will be appreciated by one skilled in the art, aspects of the present invention may be embodied as a system, method, or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Further, a computer storage medium may contain or store a computer-readable program code such that when the computer-readable program code is executed on a computer, the execution of this computer-readable program code causes the computer to transmit another computer-readable program code over a communications link. This communications link may use a medium that is, for example without limitation, physical or wireless.

A data processing system suitable for storing and/or executing program code will include at least one processor coupled directly or indirectly to memory elements through a system bus. The memory elements can include local memory employed during actual execution of the program code, bulk storage media, and cache memories, which provide temporary storage of at least some program code in order to reduce the number of times code must be retrieved from bulk storage media during execution.

A data processing system may act as a server data processing system or a client data processing system. Server and client data processing systems may include data storage media that are computer usable, such as being computer readable. A data storage medium associated with a server data processing system may contain computer usable code. A client data processing system may download that computer usable code, such as for storing on a data storage medium associated with the client data processing system, or for using in the client data processing system. The server data processing system may similarly upload computer usable code from the client data processing system. The computer usable code resulting from a computer usable program product embodiment of the illustrative embodiments may be uploaded or downloaded using server and client data processing systems in this manner.

Input/output or I/O devices (including but not limited to keyboards, displays, pointing devices, etc.) can be coupled to the system either directly or through intervening I/O controllers.

Network adapters may also be coupled to the system to enable the data processing system to become coupled to other data processing systems or remote printers or storage devices through intervening private or public networks. Modems, cable modem and Ethernet cards are just a few of the currently available types of network adapters.

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to explain the principles of the invention, the practical application, and to enable others of ordinary skill in the art to understand the invention for various embodiments with various modifications as are suited to the particular use contemplated.

What is claimed is:

1. A computer usable program product comprising a computer usable non-transitory storage medium including computer usable code for thermal relationships based workload planning in a data processing environment, the computer usable code comprising:
   computer usable code for determining, for a data processing system having a cooling correspondence with a cooling unit in the data processing environment, a fraction of an additional heat generation potential of the data processing system that the cooling unit will have to dissipate, wherein the additional heat generation potential of the data processing system is an amount of heat, in addition to a present amount of heat generated by the data processing system, that the data processing system will generate when the data processing system is operated at a predetermined capacity level, and wherein the cooling correspondence is a thermal relationship between the data processing system and the cooling unit;
   computer usable code for computing, using the fraction and a cooling capacity utilization of the cooling unit at a given time, an expected cooling capacity utilization; and
   computer usable code for adjusting a workload on the data processing system, responsive to the expected cooling capacity utilization exceeding a threshold.

2. The computer usable program product of claim 1, further comprising:
   computer usable code for identifying a set of factors the contribute to heat generation in the data processing system;
   computer usable code for computing a utilization of each factor in the set at the given time;
   computer usable code for estimating a maximum power consumption of the data processing system; and
   computer usable code for computing the additional heat generation potential of the data processing system using a power consumption of the data processing system at the given time, the utilization of each factor, and the estimated maximum power consumption.

3. The computer usable program product of claim 1, further comprising:
   computer usable code for repeating the determining for a plurality of data processing systems, each data processing system in the plurality having a corresponding cooling correspondence with the cooling unit, wherein the expected cooling capacity utilization is computed using a fraction of additional heat generation potential determined for each data processing system in the plurality.

4. The computer usable program product of claim 1, wherein the adjusting further comprises:
   computer usable code for selecting a first workload to be scheduled on the data processing system, the first workload contributing a first amount to the additional heat generation potential of the data processing system that the cooling unit has to dissipate;

computer usable code for selecting a second data processing system such that scheduling the first workload on the second data processing system causes the first workload to contribute a second amount to the additional heat generation potential of the second data processing system that the cooling unit has to dissipate, the second data processing system having a second cooling correspondence with the cooling unit; and computer usable code for scheduling the first workload on the second data processing system responsive to the second amount being less than the first amount.

5. The computer usable program product of claim 1, wherein the adjusting further comprises:

computer usable code for selecting a first workload to be scheduled on the data processing system at the given time, the first workload contributing a first amount to the additional heat generation potential of the data processing system that the cooling unit has to dissipate;

computer usable code for selecting a second workload executing at the given time such that the second workload contributes a second amount to heat output of the data processing system at the given time, the second amount being substantially similar to the first amount; and computer usable code for scheduling the first workload on the data processing system after the second workload has completed execution.

6. The computer usable program product of claim 1, further comprising:

computer usable code for allowing the workload to be scheduled on the data processing system at the given time, responsive to the expected cooling capacity utilization not exceeding a threshold.

7. The computer usable program product of claim 1, wherein the threshold is a maximum allowable cooling capacity utilization of the cooling unit.

8. The computer usable program product of claim 1, wherein the computer usable code is stored in a computer readable storage medium in a data processing system, and wherein the computer usable code is transferred over a network from a remote data processing system.

9. The computer usable program product of claim 1, wherein the computer usable code is stored in a computer readable storage medium in a server data processing system, and wherein the computer usable code is downloaded over a network to a remote data processing system for use in a computer readable storage medium associated with the remote data processing system.

10. A data processing system for thermal relationships based workload planning in a data processing environment, the data processing system comprising:

a storage device including a storage medium, wherein the storage device stores computer usable program code; and a processor, wherein the processor executes the computer usable program code, and wherein the computer usable program code comprises:

computer usable code for determining, for a data processing system having a cooling correspondence with a cooling unit in the data processing environment, a fraction of an additional heat generation potential of the data processing system that the cooling unit will have to dissipate, wherein the additional heat generation potential of the data processing system is an amount of heat, in addition to a present amount of heat generated by the data processing system, that the data processing system will generate when the data processing system is operated at a predetermined capacity level, and wherein the cooling correspondence is a thermal relationship between the data processing system and the cooling unit;

computer usable code for computing, using the fraction and a cooling capacity utilization of the cooling unit at a given time, an expected cooling capacity utilization; and computer usable code for adjusting a workload on the data processing system, responsive to the expected cooling capacity utilization exceeding a threshold.

11. The data processing system of claim 10, further comprising:

computer usable code for identifying a set of factors the contribute to heat generation in the data processing system;

computer usable code for computing a utilization of each factor in the set at the given time;

computer usable code for estimating a maximum power consumption of the data processing system; and computer usable code for computing the additional heat generation potential of the data processing system using a power consumption of the data processing system at the given time, the utilization of each factor, and the estimated maximum power consumption.

12. The data processing system of claim 10, further comprising:

computer usable code for repeating the determining for a plurality of data processing systems, each data processing system in the plurality having a corresponding cooling correspondence with the cooling unit, wherein the expected cooling capacity utilization is computed using a fraction of additional heat generation potential determined for each data processing system in the plurality.

13. The data processing system of claim 10, wherein the adjusting further comprises:

computer usable code for selecting a first workload to be scheduled on the data processing system, the first workload contributing a first amount to the additional heat generation potential of the data processing system that the cooling unit has to dissipate;

computer usable code for selecting a second data processing system such that scheduling the first workload on the second data processing system causes the first workload to contribute a second amount to the additional heat generation potential of the second data processing system that the cooling unit has to dissipate, the second data processing system having a second cooling correspondence with the cooling unit; and computer usable code for scheduling the first workload on the second data processing system responsive to the second amount being less than the first amount.

* * * * *